US006352812B1

(12) United States Patent
Shimazu et al.

(10) Patent No.: US 6,352,812 B1
(45) Date of Patent: Mar. 5, 2002

(54) THERMAL DIGITAL LITHOGRAPHIC PRINTING PLATE

(75) Inventors: Ken-Ichi Shimazu, Briarcliff Manor, NY (US); Jayanti Patel, Woodcliff Lake, NJ (US); Shashikant Saraiya, Parlin, NJ (US); Nishith Merchant, North Bergon, NJ (US); Celin Savariar-Hauck, Badenhausen; Hans-Joachim Timpe, Osterode, both of (DE); Christopher D. McCullough, Fort Collins, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/301,866

(22) Filed: Apr. 29, 1999

Related U.S. Application Data

(60) Provisional application No. 60/090,300, filed on Jun. 23, 1998.

(51) Int. Cl.[7] .................................................. G03F 7/09

(52) U.S. Cl. ................. 430/273.1; 430/156; 430/281.1; 430/302; 101/467

(58) Field of Search ........................... 430/273.1, 281.1, 430/156, 302; 101/467

(56) References Cited

U.S. PATENT DOCUMENTS

| | | | | | |
|---|---|---|---|---|---|
| 3,645,733 | A | | 2/1972 | Brinckman et al. | 96/36 |
| 4,687,727 | A | | 8/1987 | Toyama et al. | 430/175 |
| 5,112,743 | A | | 5/1992 | Kamiya et al. | 430/175 |
| 5,493,971 | A | | 2/1996 | Lewis et al. | 101/454 |
| 5,529,891 | A | * | 6/1996 | Wang et al. | 430/523 |
| 5,536,619 | A | * | 7/1996 | Verburgh | 430/273.1 |
| 5,569,573 | A | * | 10/1996 | Takahashi et al. | 430/138 |
| 5,609,993 | A | | 3/1997 | Hase et al. | 430/302 |
| 5,641,608 | A | | 6/1997 | Grunwald et al. | 430/302 |
| 5,858,604 | A | * | 1/1999 | Takeda et al. | 430/162 |
| 6,004,728 | A | * | 12/1999 | Deroover et al. | 430/302 |
| 6,022,667 | A | * | 2/2000 | Vermeersch et al. | 430/271.1 |
| 6,066,434 | A | * | 5/2000 | Blanchet-Fincher et al. | 430/273.1 |
| 6,083,663 | A | * | 7/2000 | Vermeersch et al. | 430/302 |
| 6,096,481 | A | * | 8/2000 | Vermeesch et al. | 430/302 |
| 6,130,026 | A | * | 10/2000 | Bennett et al. | 430/303 |
| 6,153,353 | A | * | 11/2000 | Van Damme et al. | 430/270.1 |

FOREIGN PATENT DOCUMENTS

| | | | |
|---|---|---|---|
| DE | 26 26 769 | | 1/1977 |
| DE | 42 31 324 | | 1/1993 |
| EP | 368327 | A2 | 5/1990 |
| EP | 0 678 380 | A2 | 10/1995 |
| EP | 784223 | A1 | 7/1997 |
| EP | 864419 | A1 | 9/1998 |
| EP | 864420 | A1 | 9/1998 |
| EP | 908779 | A1 | 4/1999 |
| EP | 909657 | A2 | 4/1999 |
| GB | 1245924 | | 9/1971 |
| JP | 9034110 | | 7/1995 |

* cited by examiner

*Primary Examiner*—Janet Baxter
*Assistant Examiner*—Barbara Gilmore
(74) *Attorney, Agent, or Firm*—Ratner & Prestia

(57) ABSTRACT

A thermal lithographic printing plate, which can be imaged by thermal energy typically by imagewise exposure with an infrared emitting laser, a thermal printing head, etc., is made up of a hydrophilic substrate, and a composite layer structure composed of two layer coatings. Preferably, the first layer of the composite is composed of an aqueous developable polymer mixture containing a photothermal conversion material which is contiguous to the hydrophilic substrate. The second layer of the composite is composed of one or more non-aqueous soluble polymers which are soluble or dispersible in a solvent which does not dissolve the first layer. The plate is exposed with an infrared laser or a thermal print head, and upon aqueous development of the imaged plate, the exposed portions are removed exposing hydrophilic substrate surfaces receptive to conventional aqueous fountain solutions. The unexposed portions contain the ink-receptive image areas. The second layer may also contain a photothermal conversion material. Alternatively, the composite layer may be free of photothermal conversion material when thermal imaging is carried out using a thermal printing head.

42 Claims, No Drawings

THERMAL DIGITAL LITHOGRAPHIC PRINTING PLATE

CROSS REFERENCES TO RELATED APPLICATIONS

This application claims priority from Provisional Application U.S. Serial No. 60/090,300 filed Jun. 23, 1998.

BACKGROUND OF THE INVENTION

1. Field of the Invention

The present invention relates to thermal lithographic printing plates which are imaged with an infrared laser and processed with an aqueous alkaline developer.

2. Description of Related Art

U.S. Pat. No. 5,493,971 discloses lithographic printing constructions which include a grained-metal substrate, a protective layer that can also serve as an adhesion-promoting primer, and an ablatable oleophilic surface layer. In operation, imagewise pulses from an imaging laser interact with the surface layer, causing ablation thereof and, probably, inflicting some damage to the underlying protective layer as well. The imaged plate may then be subjected to a solvent that eliminates the exposed protective layer, but which does no damage either to the surface layer or to the unexposed protective layer lying thereunder.

A heat-sensitive imaging element for making positive working lithographic printing plates is disclosed in European Patent Publication EP 0864420 A1. The imaging element disclosed comprises a lithographic base, a layer comprising a polymeric material which is soluble in an aqueous alkaline solution and an IR-radiation sensitive second layer. Upon image-wise exposure and absorption of IR-radiation in the second (top) layer, the capacity of the aqueous alkaline solution to penetrate and/or solubilize the second layer is changed. Image-wise exposure can be performed with an infrared laser with a short as well as with a long pixel dwell time.

Although advances have been made in the preparation of heat-sensitive elements for the production of lithographic printing plates, there remains a need for such elements having improved sensitivity to infrared laser imaging devices. There is also a need for longer shelf-life with wider development latitude and wider exposure latitude.

SUMMARY OF THE INVENTION

These needs are met by the present invention which is a positive-working thermal imaging element comprising;

A. a substrate; and

B. a thermally sensitive composite layer structure having an inner surface contiguous to the substrate and an outer surface, the composite layer structure comprising:

(a) a first layer having the inner surface, the first layer comprising a first polymeric material, wherein the first polymeric material is soluble or dispersible in an aqueous solution; and (b) a second layer having the outer surface, the second layer comprising a second polymeric material, wherein the second layer is insoluble in the aqueous solution, and wherein when the first layer is free of photothermal conversion material, the second layer is free of photothermal conversion material; wherein, upon heating the composite layer structure, the heated composite layer structure has an increased rate of removal in the aqueous solution.

More particularly, the present invention is a positive-working, lithographic printing plate, precursor comprising;

A. a hydrophilic substrate; and

B. a thermally sensitive composite layer structure having an inner surface contiguous to the hydrophilic substrate and an outer oleophilic surface, the composite layer structure comprising:

(a) a first layer having the inner surface, the first layer comprising a first polymeric material and photothermal conversion material, wherein the first polymeric material is soluble or dispersible in an aqueous solution; and (b) a second layer having the outer oleophilic surface, the second layer comprising a second polymeric material, wherein the second layer is insoluble in the aqueous solution; wherein, upon heating the composite layer structure, the heated composite layer structure has an increased rate of removal in the aqueous solution.

An added embodiment of this invention is a method for forming a planographic printing plate comprising the steps, in the order given:

I) providing a lithographic printing plate precursor comprising;

A. a hydrophilic substrate; and

B. a thermally sensitive composite layer structure having an inner surface contiguous to the hydrophilic substrate and an outer oleophilic surface, the composite layer structure comprising:

(a) a first layer having the inner surface, the first layer comprising a first polymeric material, wherein the first polymeric material is soluble or dispersible in an aqueous solution; and (b) a second layer having the outer oleophilic surface, the second layer comprising a second polymeric material, wherein the second layer is insoluble in the aqueous solution, and wherein when the first layer is free of photothermal conversion material the second layer is free of photothermal conversion material;

II) imagewise exposing the composite layer structure to thermal energy to provide exposed portions and complimentary unexposed portions in the composite layer structure, wherein the exposed portions are selectively removable by the aqueous solution; and III) applying the aqueous solution to the outer oleophilic surface to remove the exposed portions to produce an imaged lithographic printing plate having uncovered hydrophilic areas of the hydrophilic substrate and complimentary ink receptive areas of the outer oleophilic surface. In an added embodiment of the method of this invention, the imaged lithographic printing plate is uniformly exposed to thermal energy after step III.

In a further embodiment of this invention the first layer of the thermal imaging element contains photothermal conversion material and a photohardenable material activatable by ultraviolet radiation. In use, the thermal imaging element of this embodiment is imaged and developed according to the method of this invention to form the imaged lithographic printing plate. The imaged lithographic printing plate is then uniformly exposed to ultraviolet radiation.

In of each of the embodiments of this invention the aqueous solution preferably has a pH of about 6 or greater; the first polymeric material preferably is insoluble in an organic solvent, and the second polymeric material is soluble in the organic solvent; and the first layer preferably contains a photothermal conversion material particularly when the element is imagewise exposed with a radiant source of energy such as an infrared emitting laser. Preferably, the second layer is free of the photothermal conversion material.

DETAILED DESCRIPTION OF THE INVENTION

This invention relates to an imaging element which can be imaged with thermal energy. More particularly, this invention relates to thermal lithographic printing plates, which can be imaged by thermal energy typically by imagewise exposure with an infrared emitting laser, a thermal printing head, or the like. The lithographic plates described in this invention are made up of a hydrophilic substrate, typically an aluminum or polyester support, and adhered thereto, a thermally sensitive composite layer structure typically composed of two layer coatings. An aqueous developable polymeric mixture typically containing a photothermal conversion material is coated on the hydrophilic substrate to form the first layer. The second layer is composed of one or more non-aqueous soluble polymeric materials which are soluble or dispersible in a solvent which does not dissolve the first layer. In the positive-working thermal imaging element of this invention, the term "photothermal conversion material" is intended to be one or more thermally sensitive components which absorb incident radiation and convert the radiation to thermal energy. Typically, the photothermal conversion material is an "infrared absorbing" compound. When the first layer contains a photothermal conversion material, i.e., a first material, the second layer may contain the same first material or a different photothermal conversion material, i.e., a second material. As used herein, the term "thermally sensitive" is intended to be synonymous with the term "heat sensitive", and the term "image area(s)" is intended to mean the surface area(s) of the imaged plate which is ink-receptive. The plate is exposed in non-image area(s), i.e., areas outside the "image areas" which are not ink-receptive, typically with an infrared laser or a thermal print head. Upon aqueous development of the imaged plate, the exposed portions are developed away thus exposing hydrophilic surfaces of the substrate which are receptive to conventional aqueous fountain solutions. The second layer composed of ink-receptive image areas, protects the underlying aqueous-soluble coating areas from the aqueous developer. In one embodiment of this invention, the second layer may also contain a photothermal conversion material. In this instance, imaging exposure may result in at least partial removal of exposed areas of the second layer from the underlying coating. Any remaining exposed areas of the second layer are removed during development of the imaged plate. In the following description, the invention will be illustrated using infrared radiation, and infrared absorbing material as the photothermal conversion material, but is not intended to be limited thereby.

Plate Construction

The plate construction of the present invention includes a composite layer structure supported by a substrate. The composite layer structure contains at least an ink-receptive, aqueous-insoluble second layer overlying an aqueous-soluble infrared absorbing layer which is adhered to the surface of the substrate. The composite structure may additionally contain intermediate layers such as substrate subbing layers to enhance hydrophilicity or adhesion to the composite structure, or an adhesion promoting interlayer between the second layer and the infrared absorbing layer.

Substrate

Hydrophilic substrates which may be used in the planographic plate of this invention may be any sheet material conventionally used to prepare lithographic printing plates such as metal sheet materials or polymeric sheet material. A preferred metal substrate is an aluminum sheet. The surface of the aluminum sheet may be treated with metal finishing techniques known in the art including brushing roughening, electrochemical roughening, chemical roughening, anodizing, and silicate sealing and the like. If the surface is roughened, the average roughness Ra is preferably in the range from 0.1 to 0.8 μm, and more preferably in the range from 0.1 to 0.4 μm. The preferred thickness of the aluminum sheet is in the range from about 0.005 inch to about 0.020 inch. The polymeric sheet material may be comprised of a continuous polymeric film material, a paper sheet, a composite material or the like. Typically, the polymeric sheet material contains a sub-coating on one or both surfaces to modify the surface characteristics to enhance the hydrophilicity of the surface, to improve adhesion to subsequent layers, to improve planarity of paper substrates, and the like. A preferred polymeric substrate comprises polyethylene terephthalate.

Thermally-Sensitive Composite Layer Structure

First Layer:

The first layer of the composite layer structure is composed of a polymeric material and optionally, a first photothermal conversion material such as an infrared absorbing compound, in which the polymeric material is soluble or dispersible in an aqueous solution having a pH of about 6 or greater, i.e., in a slightly acidic, neutral or alkaline aqueous solution. Optionally, the first layer may contain a photohardenable material in addition to the thermal conversion material. Useful polymeric materials contain acid functionality and may be composed of one or more polymers or resins. Such polymers and resins include carboxy functional acrylics, acrylics which contain phenol groups and/or sulfonamide groups, cellulosic based polymers and copolymers, vinyl acetate/crotonate/vinyl neodecanoate copolymers, styrene maleic anhydride copolymers, polyvinyl acetals, phenolic resins, maleated wood rosin, and combinations thereof. Typically two polymers are used in combination to achieve the desirable solubility in a wholly aqueous solution having a pH of about 6 or greater and typically between about 8 and about 13.5. A further criterion for the polymeric material, is that it be insoluble in an organic solvent for the second layer hereinafter discussed.

In a preferred embodiment of this invention, the first layer contains a first photothermal conversion material such as an infrared absorber. An infrared absorber may be selected from either a dye or pigment. A primary factor in selecting the infrared absorber is its extinction coefficient which measures the efficiency of the dye or pigment in absorbing infrared radiation in accordance with Beer's Law. The extinction coefficient must have a sufficient value in the wavelength region of infrared radiation exposure usually from 780 nm to 1300 nm. Examples of infrared absorbing dyes useful in the present invention include, Cyasorb IR 99 and Cyasorb IR 165 (both available from Glendale Protective Technology), Epolite IV-62B and Epolite III-178 (both available from the Epoline Corporation), PINA-780 (available from the Allied Signal Corporation), Spectra IR 830A and Spectra IR 840A (both available from Spectra Colors Corporation), ADS 830A and ADS 1060A (ADS Corp) and EC 2117 (FEW Wolfen). Examples of infrared absorbing pigments are Projet 900, Projet 860 and Projet 830 (all available from the Zeneca Corporation). Carbon black pigments may also be used. Carbon black pigments are particularly advantageous due to their wide absorption bands since such carbon black-based plates can be used with multiple infrared imaging devices having a wide range of peak emission wavelengths.

In addition to the photothermal conversion material, the first layer may also contain a photohardenable material which is activatable by ultraviolet radiation. With the addition of the photohardenable material, printing plates with high press life and resistance to press room chemicals are produced. As used herein the term "photohardenable" material is intended to mean any component or group of components which, upon activation by ultraviolet radiation forms a matrix within the first layer by polymerization and/or crosslinking, so as harden and/or insolubilize the first layer; and/or to interact with surfaces of adjacent layers to increase adherence thereto. The photohardenable material may contain a photopolymerizable component, a photocrosslinkable component, or a combination thereof. Such photohardenable materials may additionally contain a photoinitiating system and/or a photosensitizing system. Without being bound by any particular theory, it is believed that the photohardenable material may form a matrix independent of the first polymeric material; may function to crosslink the first polymeric material; may function to chemically bond the first layer to the second layer; or a combination thereof. Typical photohardenable materials include diazonium polycondensation products, photoinitiated free radical polymerizable systems, hybrid combinations of diazonium polycondensation products and photoinitiated free radical polymerizable systems, cationically or anionically photopolymerizable systems, and systems which undergo photocrosslinking by photodimerization or photocycloaddition. Typically such photohardenable material contain a photoinitiating system, a photosensitizing system or a combination thereof. Such photoinitiating systems include conventional photoinitiators which form free radicals or ionic catalysts upon exposure to ultraviolet radiation. Such photosensitizing systems include conventional photosensitizing compounds which extend the effective spectral region of the photoinitiating system into the near ultraviolet and visible spectral region. Preferred among these photohardenable materials are those based on diazonium polycondensation products and systems which undergo photocycloaddition. Examples of such diazonium polycondensation products are described in U.S. Pat. No. 4,687,727 which is incorporated herein by reference. A preferred product is derived from polycondensation of 3-methoxydiphenylamine-4-diazonium sulfate and 4,4'-bis-methoxymethyidiphenylether, isolated as the mysitylene sulfonate salt, and available from Panchim as Nega 107. Systems based on photocycloaddition are described in U.S. Pat. No. 5,112,743 which is incorporated herein by reference, EP A 368 327 and DE 198 47 616.7. The effective spectral region of the latter systems can be extended into the near ultraviolet and visible regions using photosensitizers as described in DE 42 31 324 and DE 26 26 769. Preferred photosensitizers are thioxanthone derivatives.

Second Layer:

The second layer of the composite layer structure, i.e. the top layer, contains as an essential ingredient a polymeric material which is ink-receptive, is insoluble in the aqueous solution having a pH of about 6 or greater, and is soluble or dispersible in a solvent such as an organic solvent or an aqueous solvent dispersion. Useful polymers of this type include acrylic polymers and copolymers; polystyrene; styrene-acrylic copolymers; polyesters, polyamides; polyureas; polyurethanes; nitrocellulosics; epoxy resins; and combinations thereof. Preferred are polymethylmethacrylate and polystyrene. When the first layer contains a photothermal conversion material, the second layer may also contain a photothermal conversion material, which typically is the same infrared absorbing dye which is used as the photothermal conversion material in the first infrared absorbing layer. The second layer may also contain a dye or pigment, such as a printout dye added to distinguish the exposed areas from the unexposed areas during processing; or a contrast dye to distinguish image areas in the finished imaged plate. The second layer may also contain polymeric particles which are incompatible with the second polymeric material. As used herein the term "incompatible" is intended to mean that the polymeric particles are retained as a separate phase within the second polymeric material. Typically, the polymeric particles have an average diameter between about 0.5 μm and about 10 μm. Preferred polymeric particles of this type are poly tetrafluoroethylene particles. The presence of such polymeric particles improves scratch resistance of the composite layer and surprisingly enhances exposure latitude for processing the plate. Typically, the second layer is substantially free of ionic groups.

Plate Precursor Preparation

The composite layer structure may be applied to the substrate by sequentially applying the first layer and then the second layer using conventional coating or lamination methods. Alternatively, both layers may be applied at the same time or from a single solution which undergoes self-stratification into top and bottom layers upon drying. However it is important to avoid intermixing the two layers which tends to reduce the sensitivity. Regardless of the method of application, the first layer of the applied composite has an inner surface which is contiguous to the substrate, and the second layer of the applied composite has an outer surface.

The first layer may be applied to the hydrophilic substrate by any conventional method. Typically the ingredients are dissolved or dispersed in a suitable coating solvent, and the resulting solvent mixture is coated by known methods such as by whirl coating, bar coating, gravure coating, roller coating, and the like. Suitable coating solvents include alkoxyalkanols such as 2-methoxyethanol; ketones such as methyl ethyl ketone; esters such as ethyl acetate or butyl acetate; and mixtures thereof.

The second or top layer may be applied to the surface of the thermal conversion layer by any conventional method such as those described above. Typically the ingredients are dissolved or dispersed in a suitable organic coating solvent which is not a solvent for the thermal conversion layer. Suitable coating solvents for coating the second layer include aromatic solvents such as toluene and mixtures of aromatic solvents with alkanols such as a 90:10 weight ratio of toluene and butanol.

Alternatively, the first layer, the second layer or both layers may be applied by conventional extrusion coating methods from a melt mixture of layer components. Typically, such a melt mixture contains no volatile organic solvents.

Plate Imaging and Processing

The thermal digital lithographic printing plate precursor is imaged by the method comprising the following steps. First a lithographic printing plate precursor is provided which comprises a hydrophilic substrate and adhered thereto, a composite layer structure having an inner surface contiguous to the hydrophilic substrate and an outer oleophilic, ink-receptive surface. The composite layer structure comprises a first layer which forms the inner surface of the composite layer structure and a second layer which forms the outer surface of the composite layer structure. The first layer comprises a first polymeric material and a photothermal conversion material, as previously described, in which the first polymeric material is soluble or dispersible in an aqueous solution having a pH of about 6 or greater, and which is insoluble in an organic solvent. The second layer consists essentially of a second polymeric material, as previously described, which is soluble in the organic solvent, wherein the second layer is insoluble in the aqueous solution. Next the composite layer structure is imagewise exposed to thermal energy to provide exposed portions, or areas, and complimentary unexposed portions, or areas, in the composite layer structure. The exposed portions surprisingly are selectively removable by the aqueous solution. Finally, the aqueous solution is then applied to the outer oleophilic surface to remove the exposed portions of the composite layer structure to produce an imaged lithographic printing plate. The resulting imaged lithographic printing plate has uncovered hydrophilic areas of the hydrophilic substrate and complimentary ink receptive areas of the outer oleophilic surface. While not being bound by any particular theory, selective removability of the exposed portions is believed to result from an increased rate of dissolution or dispersibility of the first layer in the aqueous solution, from enhanced permeability of the second layer to the aqueous solution or to a combination thereof.

The lithographic plate of this invention and its methods of preparation have already been described above. This plate may be imaged with a laser or an array of lasers emitting infrared radiation in a wavelength region that closely matches the absorption spectrum of the first infrared absorbing layer. Suitable commercially available imaging devices include image setters such as a Creo Trendsetter (available from the CREO Corporation, British Columbia, Canada) and a Gerber Crescent 42T (available from the Gerber Corporation). While infrared lasers are preferred other high intensity lasers emitting in the visible or ultraviolet may also be used to image the lithographic plate of this invention. Alternatively, the lithographic plate of this invention may be imaged using a conventional apparatus containing a thermal printing head or any other means for imagewise conductively heating the composite layer such as with a heated stylus, with a heated stamp, or with a soldering iron as illustrated in the following examples.

When portions of the composite layer structure are exposed to infrared radiation, they become selectively removable by an aqueous developer liquid and are removed thereby. The developer liquid may be any liquid or solution which can both penetrate the exposed areas and dissolve or disperse the exposed areas of the infrared absorbing layer without substantially affecting the complimentary unexposed portions of the composite layer structure. Useful developer liquids are the aqueous solutions having a pH of about 6 or above as previously described. Preferred developer solutions are those that have a pH between about 8 and about 13.5. Useful developers include commercially available developers such as PC3000, PC955, PC956, and PC9000 aqueous alkaline developers each available from Kodak Polychrome Graphics, LLC. Typically the developer liquid is applied to the imaged plate by rubbing or wiping the second layer with an applicator containing the developer liquid. Alternatively, the imaged plate may be brushed with the developer liquid or the developer liquid may be applied to the plate by spraying the second layer with sufficient force to remove the exposed areas. Alternatively, the imaged plate can be soaked in the developer liquid, followed by rubbing or brushing the plate with water. By such methods a developed printing plate is produced which has uncovered areas which are hydrophilic and complimentary areas of the composite layer, not exposed to infrared radiation, which are ink receptive.

Although lithographic printing plates having high press life with good ink receptivity are produced at high imaging speeds by the method of this invention, press life surprisingly is further enhanced by uniformly exposing the imaged lithographic printing plate to thermal energy after it has been developed in step III. Such a uniform thermal exposure may be carried out by any conventional heating technique, such as baking, contact with a heated platen, exposure to infrared radiation, and the like. In a preferred mode for post development thermal exposure, the developed imaged lithographic printing plate is passed through a baking oven at 240° C. for 3 minutes after treatment with a baking gum.

When the first layer of the lithographic printing plate precursor element contains a photohardenable material, the developed, imaged lithographic printing plate may be uniformly exposed to ultraviolet radiation to further enhance press life and resistance to press room chemicals. Such post development flood exposures may be carried out using any conventional ultraviolet exposure source. In a typical post development flood exposure, the developed, imaged plate is placed in a conventional exposure device such as a 5W Theimer device for 20 seconds. As used herein, the term "ultraviolet radiation" is intended to include actinic radiation within the spectral region from about 2500 Å to about 4200 Å with the near ultraviolet spectral region from about 3600 Å to about 4000 Å being preferred.

The thermal lithographic printing plate of the present invention will now be illustrated by the following examples, but is not intended to be limited thereby.

EXAMPLE 1

A lithographic printing plate was prepared as follows:

First Layer: 2.5 grams of 28-2930 copolymer (vinyl acetate/crotonates/vinyl neodecanoate copolymer from National Starch and Chemical Co.) and 2.5 grams of Scripset-550 (styrene maleic anhydride copolymer from Monsanto) were dissolved in 50 mL of 2-methoxyethanol and 50 mL methyl ethyl ketone solvent mix. 0.9 g. of ADS-830A dyes (American Dye Source Inc.) was added to this solution and stirred until all the ingredients were completely dissolved. The solution was then coated on an aluminum lithographic substrate to achieve a 2.0 g/m$^2$ coating.

Second layer: 13.2 g of A-21 (a 30% solution of polymethylmethacrylate (PMMA) in toluene/butanol 90:10 solvent mixture from Rohm & Haas) was dissolved in 190 g. of toluene. The solution was stirred and then coated on top of the above mentioned First layer coated plate.

The plate precursor was laser imaged on a Creo Trendsetter thermal exposure device having a laser diode array emitting at 830 nm with a dose of 100 to 300 mJ/cm$^2$. Upon alkali development with positive developer PC3000 (from Kodak Polychrome Graphics) having a pH of about 13.5, laser exposed areas of both the bottom and second layers were removed without affecting the unexposed areas of either layer.

When ADS-830A dye, in the amount indicated above, was added to both the First layer and the second layer of the plate precursor, similar results were obtained following thermal imaging and development as above.

When the plate precursor was prepared using Epolite III-178 dye (Epolin Inc.) in place of ADS-830A dye in the First layer, similar results were obtained following thermal imaging with a Gerber Crescent 42T exposure device, emitting at 1064 nm, and development as above.

When the plate precursor was prepared using Epolite III-178 dye in place of ADS-830A dye in both the First layer and the second layer, similar results were obtained following thermal imaging with a Gerber Crescent 42T exposure device and development as above.

When the plate precursor was thermally imaged with a Weller soldering iron (EC2100M), followed by development in an aqueous solution of sodium metasilicate pentahydrate (14 wt %), a positive image was similarly obtained. Similar results were obtained by scanning the coating or the substrate side of the plate precursor with the soldering iron at a rate of 10 cm/sec.

When the plate precursor was prepared without the addition of an IR absorber, thermal imaging with the Weller soldering iron, followed by development in the sodium metasilicate solution also provided a positive image. Similar results were obtained by scanning either the coating or the substrate side of the plate precursor.

EXAMPLE 2

A lithographic printing plate was prepared as follows:

First Layer: 2.5 g. of SMA-1000 polymer (styrene maleic anhydride copolymer from ARCO Chemical) and 2.5 g. of PN430 resin (phenolic resin from American Hoeschst) were dissolved in 50 mL of 2-methoxyethanol and 50 mL of methyl ethyl ketone solvent mix. 0.9 g. ADS-830A dye was added to this solution. The solution was stirred to dissolve all three components completely and was then coated on a lithographic substrate to achieve 2.0 g/m$^2$ coating weight using a whirl coater.

Second layer: 13.2 g. of A-21 was dissolved on 190 g. of toluene. The solution was stirred and then coated on top of the above mentioned First layer coated plate.

This plate was laser imaged on a Creo Trendsetter system as described in Example 1. Upon alkali development with positive developer PC3000, laser exposed areas of both the first and second layers were removed without affecting the unexposed areas of either layer.

In accordance with Example 1, similar results were obtained when ADS-830A dye was added to both the first and the second layers; similar results were also obtained when ADS-830A dye was replaced by Epolite III-178 dye, in the First layer or in both layers, and the plate precursor was exposed in the Gerber Crescent 42T device.

EXAMPLE 3

A lithographic printing plate was prepared as follows:

First Layer: 2.5 g. of SD-140 resin, a phenol novolac resin, and 2.5 g. of 28-2930 copolymer were dissolved in 50 mL of 2-methoxyethanol and 50 mL of methyl ethyl ketone solvent mix. 0.9 g. ADS-830 dye was added to this solution. The solution was stirred to dissolve all three components completely. The solution was then coated on lithographic substrate to achieve 2.0 g/m$^2$ coating weight using a whirl coater.

Second layer: A 2% solution of Acryloid B44 resin, an acrylic copolymer from Rohm & Haas having a Tg=60° C., in toluene was applied on top of the above mentioned First layer coated plate.

This plate was laser imaged on a Creo Trendsetter system as described in Example 1. Upon alkali development with positive developer PC3000, laser exposed areas of both the first and second layers were removed without affecting the unexposed areas of either layer.

In accordance with Example 1, similar results were obtained when ADS-830A dye was added to both the first and the second layers; similar results were also obtained when ADS-830A dye was replaced by Epolite III-178 dye, in the first layer or in both layers, and the plate precursor was exposed in the Gerber Crescent 42T device.

EXAMPLE 4

A lithographic printing plate was prepared as follows:

First Layer: 2.5 g. of cellulose acetate phthalate and 2.5 g. of 28-2930 copolymer were dissolved in 50 mL of 2-methoxyethanol and 50 mL of methyl ethyl ketone solvent mix. 0.9 g. ADS-830 dye was added to this solution. The solution was stirred to dissolve all three components completely. A solution was then coated on lithographic substrate to achieve 2.0 g/m coating weight using a whirl coater.

Second layer: A 2% solution of Acryloid B-66 resin (an acrylic copolymer from Rohm & Haas having a Tg=50° C.) in toluene was applied on top of the above mentioned First layer coated plate.

This plate was laser imaged on a Creo Trendsetter system as described in Example 1. Upon alkali development with positive developer PC3000, laser exposed areas of both the first and second layers were removed without affecting the unexposed areas of either layer.

In accordance with Example 1, similar results were obtained when ADS-830A dye was added to both the first and the second layers; similar results were also obtained when ADS-830A dye was replaced by Epolite III-178 dye, in the First layer or in both layers, and the plate precursor was exposed in the Gerber Crescent 42T device.

EXAMPLE 5

A lithographic printing plate was prepared as follows:

First Layer: 2.5 g. of Carboset-500 (an acrylic copolymer from Goodrich) and 2.5 g. of 28-2930 copolymer were dissolved in 50 mL of 2-methoxyethanol and 50 mL of methyl ethyl ketone solvent mix. 0.9 g. ADS-830 dye was added to this solution. The solution was stirred to dissolve all three components completely. The solution was then coated on a lithographic substrate to achieve 2.0 g/m$^2$ coating weight using a whirl coater.

Second layer: A 2% solution of Acryloid B-82 (an acrylic copolymer from Rohm & Haas having a Tg=35° C.) in toluene was applied on top of the above mentioned first layer coated plate.

This plate was laser imaged on a Creo Trendsetter system as described in Example 1. Upon alkali development with positive developer PC3000, laser exposed areas of both the first and second layers were removed without affecting the unexposed areas of either layer.

In accordance with Example 1, similar results were obtained when ADS-830A dye was added to both the first and the second layers; similar results were also obtained when ADS-830A dye was replaced by Epolite III-178 dye, in the first layer or in both layers, and the plate precursor was exposed in the Gerber Crescent 42T device.

EXAMPLE 6

A lithographic printing plate was prepared as follows:

First Layer: 2.5 g. of Scripset-540 (styrene maleic anhydride copolymer from Monsanto) and 2.5 g. of 28-2930 copolymer were dissolved in 50 mL of 2-methoxyethanol and 50 mL of methyl ethyl ketone solvent mix. 0.9 g. ADS-830A dye was added to this solution. The solution was stirred to dissolve all three components completely. The solution was then coated on a lithographic substrate to achieve 2.0 g/m$^2$ coating weight using a whirl coater.

Second layer: A 2% solution of Acryloid B-84 resin (an acrylic copolymer from Rohm & Haas having a Tg=50° C.) in toluene was applied on top of the above mentioned first layer coated plate.

This plate was laser imaged on a Creo Trendsetter system as described in Example 1. Upon alkali development with positive developer PC3000, laser exposed areas of both the first and second layers were removed without affecting the unexposed areas of either layer.

In accordance with Example 1, similar results were obtained when ADS-830A dye was added to both the first and the second layers; similar results were also obtained when ADS-830A dye was replaced by Epolite III-178 dye, in the First layer or in both layers, and the plate precursor was exposed in the Gerber Crescent 42T device.

EXAMPLE 7

A lithographic printing plate was prepared as follows:

First Layer: 2.5 g. of Scriptset-550 and 2.5 g. of 28-2930 copolymer were dissolved in 50 mL of 2-methoxyethanol and 50 mL of methyl ethyl ketone solvent mix. 0.9 g. ADS-830 dye was added to this solution. The solution was stirred to dissolve all three components completely. The solution was then coated on a lithographic substrate to achieve 2.0 g/m$^2$ coating weight using a whirl coater.

Second layer: A 2% solution of polystyrene in toluene was applied on top of the above mentioned first layer coated plate.

This plate was laser imaged on a Creo Trendsetter system as described in Example 1. Upon alkali development with positive developer PC3000, laser exposed areas of both the first and second layers were removed without affecting the unexposed areas of either layer.

In accordance with Example 1, similar results were obtained when ADS830A dye was added to both the first and the second layers; similar results were also obtained when ADS-830A dye was replaced by Epolite III-178 dye, in the first layer or in both layers, and the plate precursor was exposed in the Gerber Crescent 42T device.

EXAMPLE 8

A lithographic printing plate was prepared as follows:

First Layer: A carbon dispersion was made by dispersing 15 g carbon black (Spezialschwarz 250 from Degussa) in a solution of 30 g of PD 140 A resin (cresol novolac resin from Borden) in 55 g 2-methoxyethanol. 4.33 g of this dispersion was stirred into a solution made up of 3.7 g PD 140A resin, 0.35 g EC 2117 IR dye (available from FEW Wolfen GmbH), 30 mL methyl ethyl ketone and 30 mL 2-methoxyethanol and coated on a lithographic substrate to obtain 1.8 g/m$^2$ coating weight.

Second layer: 5 g of A-21 was dissolved on 100 mL toluene. The solution was stirred and then coated on top of the above mentioned first layer coated plate to give a coating weight of 1.0 g/m$^2$.

This plate was laser imaged on a Creo Trendsetter system as described in Example 1. Upon development with developer Goldstar from Kodak Polychrome Graphics, laser exposed areas of both first and second layers were removed without affecting the unexposed areas of either layer.

EXAMPLE 9

A lithographic printing plate was prepared as follows:

First Layer: A polymeric solution was prepared by dissolving 1.25 g of 28-2930 copolymer, 1.25 g of Scriptset-550, 2.5 g of negative diazo N-5000 (condensation product of p-diazo diphenylamine bisulfate and formaldehyde isolated as the 2-hydroxy-4-methoxy benzophenone-5-sulfonate salt), and 0.9 g of ADS-830A IR dye into a solvent mixture containing 45 mL methyl ethyl ketone and 55 mL 2-methoxyethanol. The solution was spin coated on an electrolytically grained aluminum substrate to obtain a coating weight of 1.8 g/m$^2$.

Second layer: A solution containing 2.0 g of PMMA and 0.26 g of MP-1100 (polytetrafluoroethylene additive, available from DuPont Co.) in 100 g. toluene was coated on the above layer to obtain a coating weight of 0.6 g/m$^2$.

Two plates were imaged on the Creo Trendsetter thermal plate setter (wavelength 830 nm) at energy density between 140 and 240 mJ/cm$^2$. The plates were then developed with T-153 aqueous developer (from Kodak Polychrome Graphics) to produce printing plates having acceptable resolution.

One of the above developed plates was then flood exposed with UV radiation with a dose of 350 mJ/cm$^2$ using a SACK LCX3 5W source. Both the UV flood exposed and unexposed plates were then soaked for 2 min in developer T-153. The UV exposed plate exhibited higher resistance to developer and solvent.

EXAMPLE 10

A lithographic printing plate was prepared as follows:

First Layer: 2.13 g of a carboxy-functional polyvinyl acetal (described in preparation example 11 of U.S. Pat. No. 5,700,619 which is incorporated herein by reference) (T71 polymer), 2.13 g Nega 107 (a negative diazo resin derived from polycondensation of 3-methoxy-diphenylamine-4-diazonium sulfate and 4,4'-bismethoxymethyidiphenyl ether, isolated as the mesitylene sulfonate salt, and available from Panchim) and 0.15 g EC. 2117 IR 830 dye were dissolved in 50 mL of a solvent mixture of 2-methoxyethanol, methanol and methyl ethyl ketone (35:25:40). The solution was coated on an electrolytically grained, anodized and polyvinylphoshonic acid sealed substrate to obtain a coating weight of 1.4 g/m$^2$.

Second layer: A solution of 2 g nitrocellulose E950 (available from Wolff Walsrode) in 100 mL ethylacetate was coated on the above layer to give a coating weight of 1.1 g/m$^2$.

Two plates were laser imaged with a 810 nm laser diode mounted on a rotating drum to provide single lines and solid areas. The plates were then developed with aqueous alkaline developer 956 (from Kodak Polychrome Graphics) to obtain a good image with a clean background.

One of the plates was then flood exposed to UV radiation with a dose of 300 mJ/cm$^2$, using a SACK LCX3 5W radiation source. Both plates were soaked in diacetone alcohol for 15 minutes, resulting in a coating weight loss of 94% for the plate which was not flood exposed. The flood exposed plate had a weight loss of 46%, corresponding mainly to the loss of the nitrocellulose second layer. These results indicate that the photohardenable first layer was crosslinked during flood exposure.

EXAMPLE 11

A lithographic printing plate was prepared as follows:

First Layer: A carbon dispersion AC 252 with 14.4% solid content was made by dispersing 20 g of T71 resin and 10 g carbon black (Spezialschwarz 250 from Degussa) in Dowanol PM. A coating solution was made up of 6.38 g of the dispersion, 0.41 g of T71 resin, 1.0 g of Nega 107 and 0.03 g of phosphoric acid in a solvent mixture of 2-methoxyethanol, methanol and methyl ethyl ketone (35:25:40). The solution was coated on an electrolytically grained, anodized and polyvinylphosphoric acid sealed substrate to obtain a coating weight of 1.0 g/m$^2$.

Second layer: A solution of 5 g PMMA in 100 mL toluene was coated on the above layer to give a coating weight of 0.5 g/m$^2$.

The plate was laser imaged with a 810 nm laser diode mounted on a rotating drum to obtain single lines and solid areas. The plate was then developed with aqueous alkaline developer 956 to obtain a good image with a clean background.

EXAMPLE 12

A lithographic printing plate was prepared as follows:

First Layer: 5.1 g AK 128 (a polyvinylacetal containing dimethyl maleimido groups, described in DE 198 47 616.7 by Kodak Polychrome Graphics), 0.3 g Quantacure CPTX (thioxanthone derivative), 0.6 g EC 2117 IR 830 dye and 0.06 g 4-toluene sulfonic acid were dissolved in 80 mL of a solvent mixture of 2-ethoxyethanol, methanol and methyl ethyl ketone (35:25:40). The solution was coated on an electrolytically grained, anodized and polyvinylphosphonic acid sealed substrate to obtain a coating weight of 1.5 g/m$^2$.

Second layer: A solution of 5 g PMMA in 100 mL toluene was coated on the above layer to give a coating weight of 0.6 g/m$^2$.

Two plates were laser imaged with a 810 nm laser diode mounted on a rotating drum to provide single lines and solid areas. The plates were then developed with an aqueous alkaline developer 956 to obtain a good image with a clean background.

One of the plates was then flood exposed to UV radiation with a dose of 150 mJ/cm$^2$, using a SACK LCX3 5W radiation source. Both plates were soaked in diacetone alcohol for 15 minutes, resulting in a coating weight loss of 95% for the plate which was not flood exposed. The flood exposed plate had a weight loss of 37%, corresponding mainly to the loss of the PMMA second layer. These results indicate that the photohardenable First layer was crosslinked during flood exposure.

EXAMPLE 13

A lithographic printing plate was prepared as follows:

First Layer: To the first layer solution of Example 12, 0.3 g of Nega 107 was added and the resulting solution coated on an electrolytically grained, anodized and polyvinylphosphonic acid sealed substrate to obtain a coating weight of 1.4 g/m$^2$.

Second layer: A solution of 5 g PMMA in 100 mL toluene was coated on the above layer to give a coating weight of 0.6 g/m$^2$.

Two plates were laser imaged with a 810 nm laser diode mounted on a rotating drum to provide single lines and solid areas. The plates were then developed with aqueous alkaline developer 956 to obtain a good image with a clean background.

One of the plates was then flood exposed to UV radiation with a dose of 150 mJ/cm$^2$, using a SACK LCX3 5W radiation source. Both plates were soaked in diacetone alcohol for 15 minutes, resulting in a coating weight loss of 93% for the plate which was not flood exposed. The flood exposed plate had a weight loss of 32%, corresponding mainly to the loss of the PMMA second layer. These results indicate that the photohardenable first layer was crosslinked during flood exposure.

Those skilled in the art having the benefit of the teachings of the present invention as hereinabove set forth, can effect numerous modifications thereto. These modifications are to be construed as being encompassed within the scope of the present invention as set forth in the appended claims.

What is claimed is:

1. A positive-working thermal imaging element comprising;

A. a substrate; and

B. a thermally sensitive composite layer structure having an inner surface contiguous to the substrate and an outer surface, the composite layer structure comprising:

(a) a first layer having the inner surface, the first layer comprising a first polymeric material, wherein the first polymeric material is soluble or dispersible in an aqueous solution; and (b) a second layer having the outer surface, the second layer comprising a second polymeric material, wherein the second layer is insoluble in the aqueous solution, and wherein when the first layer is free of photothermal conversion material, the second layer is free of photothermal conversion material; wherein, upon heating the composite layer structure, the heated composite layer structure has an increased rate of removal in the aqueous solution.

2. The imaging element of claim 1 wherein the aqueous solution has a pH of about 6 or greater.

3. The imaging element of claim 1 wherein the first layer contains photothermal conversion material.

4. The imaging element of claim 3, wherein the second layer contains photothermal conversion material.

5. The imaging element of claim 4 wherein photothermal conversion material in the first layer and photothermal conversion material in the second layer are the same material.

6. The imaging element of claim 3, wherein the second layer is free of photothermal conversion material.

7. The imaging element of claim 1 wherein the imaging element is insensitive to infrared radiation when the first layer is free of photothermal conversion material.

8. The imaging element of claim 1 wherein upon heating the composite layer structure, the first layer has an increased rate of dissolution or dispersibility in the aqueous solution.

9. The imaging element of claim 1 wherein upon heating the composite layer structure, the second layer has enhanced permeability to the aqueous solution.

10. A positive-working, lithographic printing plate precursor comprising;

A. a hydrophilic substrate; and

B. a thermally sensitive composite layer structure having an inner surface contiguous to the hydrophilic substrate and an outer oleophilic, ink-receptive surface, the composite layer structure comprising:

(a) a first layer having the inner surface, the first layer comprising a first polymeric material and photothermal conversion material, wherein the first polymeric material is soluble or dispersible in an aqueous solution; and (b) a second layer having the outer oleophilic, ink-receptive surface, the second layer comprising a second polymeric material, wherein the second layer is insoluble in the aqueous solution;

wherein, upon heating the composite layer structure, the heated composite layer structure has an increased rate of removal in the aqueous solution.

11. The precursor of claim 10 wherein the second layer is free of photothermal conversion material.

12. The precursor of claim 10 wherein the aqueous solution has a pH of about 6 or greater.

13. The precursor of claim 10 wherein the first polymeric material is insoluble in an organic solvent, and the second polymeric material is soluble in the organic solvent.

14. The precursor of claim 10 wherein the photothermal conversion material is an infrared absorbing compound.

15. The precursor of claim 14 wherein the infrared absorbing compound is an infrared absorbing dye or pigment.

16. The precursor of claim 10 wherein the first layer contains a photohardenable material activatable by actinic radiation.

17. The precursor of claim 16 wherein the first layer contains a photoinitiating system, a photosensitizing system or a combination thereof.

18. The precursor of claim 10 wherein the second polymeric material is selected from the group consisting of acrylic polymers and copolymers; polystyrene; styrene-acrylic copolymers; polyesters, polyamides; polyureas; polyurethanes; nitrocellulosics; epoxy resins; and combinations thereof.

19. The precursor of claim 10 wherein the second polymeric material is polymethylmethacrylate.

20. The precursor of claim 10 wherein the second layer contains a dye or pigment.

21. The precursor of claim 10 wherein the second layer contains polymeric particles which are incompatible with the second polymeric material.

22. The precursor of claim 20 wherein the polymeric particles are poly tetrafluoroethylene particles.

23. The precursor of claim 10 wherein the aqueous solution has a pH between about 8 and about 13.5.

24. The precursor of claim 10 wherein the first polymeric material contains acid functionality.

25. The precursor of claim 24, wherein the acid functionality is derived from carboxylic acid groups, phenolic groups, sulfonamide groups or a combination thereof.

26. The precursor of claim 10 wherein the first polymeric material is taken from the group consisting of carboxy functional acrylics, acrylics which contain phenol groups, acrylics which contain sulfonamido groups, cellulosic based polymers and copolymers, vinyl acetate/crotonate/vinyl neodecanoate copolymers, styrene maleic anhydride copolymers, polyvinyl acetals, phenolic resins, maleated wood rosin, and combinations thereof.

27. The precursor of claim 10 wherein the hydrophilic substrate is an aluminum substrate.

28. The precursor of claim 27 wherein the aluminum substrate has a grained oxidized surface and wherein the first layer is applied to the a grained oxidized surface.

29. The precursor of claim 10 wherein the hydrophilic substrate is a polymeric sheet material.

30. The precursor of claim 29 wherein the polymeric sheet material is comprised of polyethylene terephthalate.

31. A method for forming a planographic printing plate comprising the steps, in the order given:

I) providing a lithographic printing plate precursor comprising;

A. a hydrophilic substrate; and

B. a thermally sensitive composite layer structure having an inner surface contiguous to the hydrophilic substrate and an outer oleophilic surface, the composite layer structure comprising:

(a) a first layer having the inner surface, the first layer comprising a first polymeric material, wherein the first polymeric material is soluble or dispersible in an aqueous solution; and (b) a second layer having the outer oleophilic surface, the second layer comprising a second polymeric material, wherein the second layer is insoluble in the aqueous solution, and wherein when the first layer is free of photothermal conversion material the second layer is free of photothermal conversion material;

II) imagewise exposing the composite layer structure to thermal energy to provide exposed portions and complimentary unexposed portions in the composite layer structure, wherein the exposed portions are selectively removable by the aqueous solution; and III) applying the aqueous solution to the outer oleophilic surface to remove the exposed portions to produce an imaged lithographic printing plate having uncovered hydrophilic areas of the hydrophilic substrate and complimentary ink receptive areas of the outer oleophilic surface.

32. The method of claim 31 wherein exposed portions of the first layer in the composite layer structure have an increased rate of solubility or dispersibility in the aqueous solution.

33. The method of claim 31 wherein exposed portions of the second layer in the composite layer structure have enhanced permeability to the aqueous solution.

34. The method of claim 31 wherein the aqueous solution has a pH of about 6 or greater.

35. The method of claim 31 wherein the aqueous solution has a pH between about 8 and about 13.5.

36. The method of claim 31 wherein the first layer contains photothermal conversion material.

37. The method of claim 36 wherein imagewise exposing is carried out with an infrared emitting laser and photothermal conversion material is an infrared absorbing compound.

38. The method of claim 36 wherein imagewise exposing is carried out with a thermal printing head.

39. The method of claim 36 wherein the first layer contains a photohardenable material activatable by actinic radiation.

40. The method of claim 39 wherein after step III, the imaged lithographic printing plate is uniformly exposed to actinic radiation.

41. The method of claim 31 wherein imagewise exposing is carried out with a thermal printing head.

42. The method of claim 31 wherein, after step III, the imaged lithographic printing plate is uniformly exposed to thermal energy.

* * * * *

UNITED STATES PATENT AND TRADEMARK OFFICE
CERTIFICATE OF CORRECTION

PATENT NO. : 6,352,812 B1
DATED : March 5, 2002
INVENTOR(S) : Shimazu et al.

It is certified that error appears in the above-identified patent and that said Letters Patent is hereby corrected as shown below:

Column 15,
Line 39, delete “20” and insert therefor -- 21 --.

Signed and Sealed this

Twenty-third Day of July, 2002

*Attest:*

JAMES E. ROGAN
*Director of the United States Patent and Trademark Office*

*Attesting Officer*